United States Patent [19]

Nussbaumer

[11] Patent Number: 4,794,509

[45] Date of Patent: Dec. 27, 1988

[54] CONVERTER MODULE HAVING COOLING ELEMENTS AND A RIPPLE CONTROL TRANSMITTER APPARATUS UTILIZING THE SAME

[75] Inventor: Roland Nussbaumer, Uster, Switzerland

[73] Assignee: Zellweger Uster AG, Uster, Switzerland

[21] Appl. No.: 102,663

[22] Filed: Sep. 30, 1987

[30] Foreign Application Priority Data

Oct. 1, 1986 [CH] Switzerland ................ 03923/86

[51] Int. Cl.⁴ ............................................. H02M 7/12
[52] U.S. Cl. ................................. 363/141; 361/384; 361/394
[58] Field of Search .................. 363/68, 141, 144; 361/383, 384, 386, 388, 394

[56] References Cited

U.S. PATENT DOCUMENTS

| | | | |
|---|---|---|---|
| 3,541,433 | 11/1970 | Davis | 363/141 |
| 3,646,400 | 2/1972 | Demarest | 363/141 |
| 3,676,745 | 7/1972 | Traweek | 361/388 |
| 4,336,568 | 6/1982 | Mitchell | 361/388 |
| 4,618,817 | 10/1986 | Holtslander | 363/144 |

FOREIGN PATENT DOCUMENTS 1514450 10/1969 Fed. Rep. of Germany ...... 363/141

OTHER PUBLICATIONS

Hwauq, "Push-Pull Multi-Flow System for Air-Cooled Modulus", IBM Tech. Discl. Bul., vol. 22, No. 2, pp. 696, 7, Jul. 1979.

*Primary Examiner*—William H. Beha, Jr.
*Attorney, Agent, or Firm*—Burns, Doane, Swecker & Mathis

[57] ABSTRACT

The converter contains a number of electronic elements (3, 5, 7, 8, 9) and cooling elements (2), which are all mounted on a common holding plate (1) designed as a holding component. The holding plate (1) comprises the necessary electrical connections (10, 11, 14) and can be connected via plugs (10, 11, 14) to a base plate mounted in the corresponding device.

Owing to this modular structure, the converter can easily be adapted to varying types of power without the need for structural modifications. The converter is economic to produce and to test and is also extremely convenient to use and to maintain.

Also disclosed is ripple control transmitter apparatus in which such converters are used for frequency changing and are arranged for convenient use and good cooling.

9 Claims, 3 Drawing Sheets

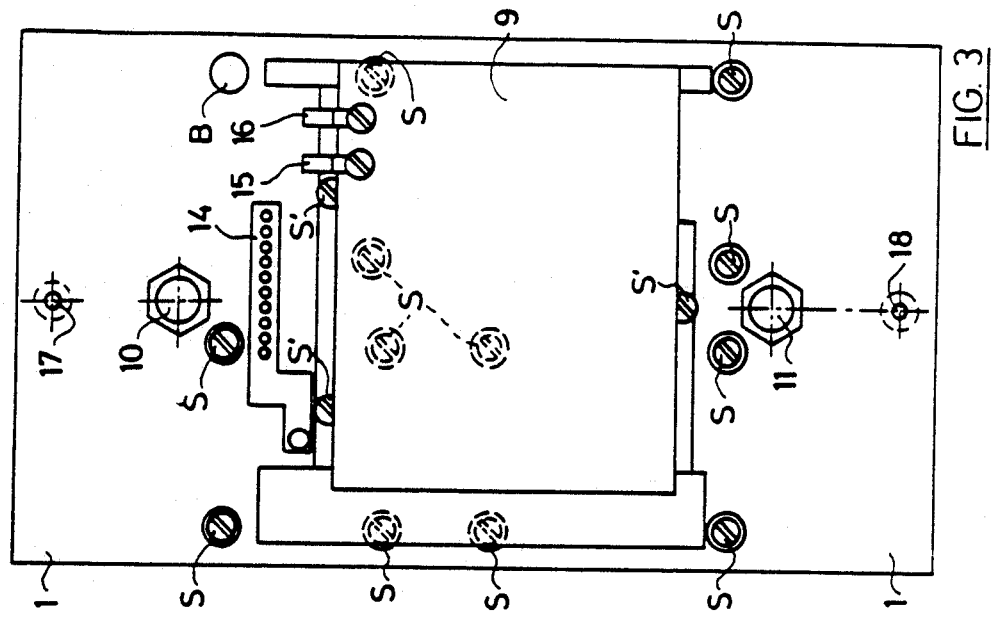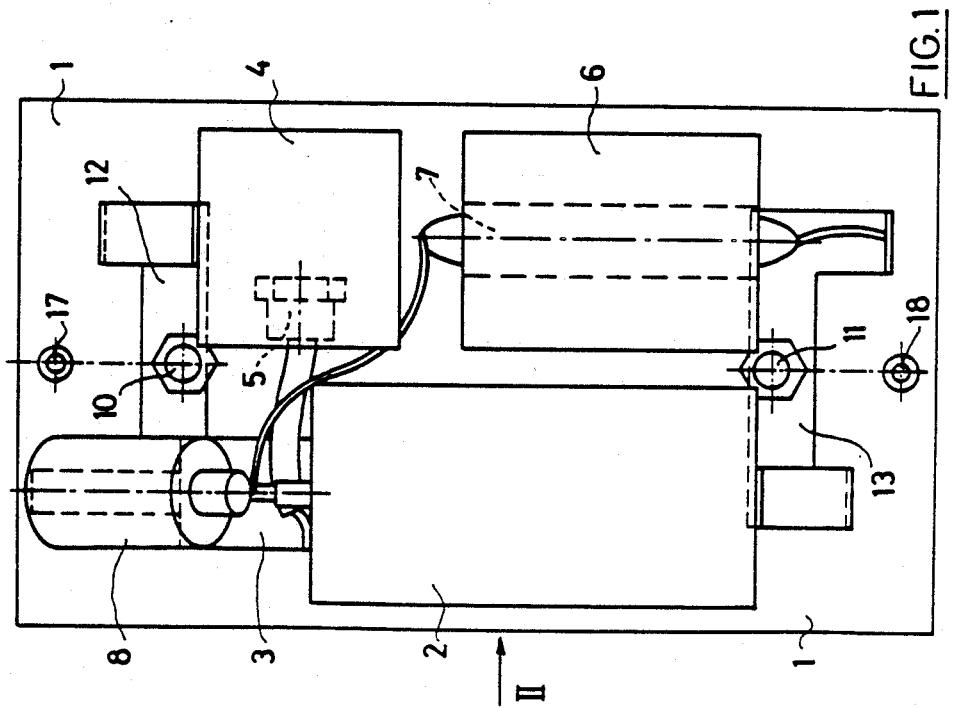

CONVERTER MODULE HAVING COOLING ELEMENTS AND A RIPPLE CONTROL TRANSMITTER APPARATUS UTILIZING THE SAME

The invention relates to a converter module with semi-conductor elements, elements for ignition, wiring elements, cooling elements and components having holding and/or insulating functions.

Converter modules of this type are widely used nowadays and are known to act as electric valves which are only permeable to current in one direction. A distinction is made between so-called true valves and false valves, thyristors being used as true valves nowadays. A converter module of this type has to have mountings for various elements, must be economic to produce and must be adaptable to various power requirements as far as possible without structural modifications of the holding components, and in addition has to overcome problems of an electrical nature. These reside, in particular, in the presence of high voltages and currents which lead to not inconsiderable insulation problems, in the fact that only very short electrical connections are allowed as a function of the frequencies occurring and in the high power losses occurring in a relatively small space.

It has not been possible to solve these problems satisfactorily in the past, and, in particular, there are no converter modules which can be designed for various powers without in-depth modifications to the holding components.

Accordingly, the invention provides a converter module which is distinguished by simple and well-arranged design and therefore by service-friendliness, which can be produced and tested economccally and which allows the use of the same holding component for various types of power.

This object is achieved according to the invention in that the above-mentioned elements are arranged on a common holder designed as a holding component which has the necessary elecrrical connections and can be detachably connected to a base plate mounted in a suitable device.

The converter module according to the invention is thus modular in design and can easily be adapted to various types of power and/or structural shapes by equipping the holder in a suitable way. It is also economical to produce because the individual converter modules can be readily produced and tested as sub-groups and, moreover, it is extremely convenient to use and to maintain.

The invention also relates to the use of the above-mentioned converter module as frequency changer for ripple control transmitters, several, preferably six, converter modules being arfanged in a common housing with a ventilation device.

This use is characterised in that the individual converter modules are arranged in rows and columns in a common plane as assembly block and this assembly block is designed as a ventilation duct.

The invention is described in more detail below with reference to the embodiment illustrated in the drawings.

FIG. 1 shows a front view of a converter module according to the invention on a scale of 1:2.

FIG. 3 shows a view in the direction of the arrow III in FIG. 2.

The converter module shown in the Figures is one in which a thyristor is used as electrical valve.

As the electronic circuit and the design thereof do not form the subject of the present patent application, they are not described in more detail here, but reference is made in this connection to the publications "Einfuhrung in die Stromrichtertechnik" by Otto Kolb, Fachschriftenverlag Aargauer Tagblatt AG, Aarau/Switzerland 1976 and "DECABIT, das neue elektronische AEG-Zellweger-Rundsteuersystem" by Walter Dehn in Technische Mitteilungen AEG-TELEFUNKEN 61 (1971) 6.

When used as frequency changers for ripple control transmitters, such converter modules contain a free-wheel diode, a so-called "Snubber" circuit with a resistor and a capacitor as well as a respective cooling element for the thyristor, the free-wheel diode and the resistor, in addition to the thyristor and the components connected to it (ignition and wiring elements).

Figure 2:
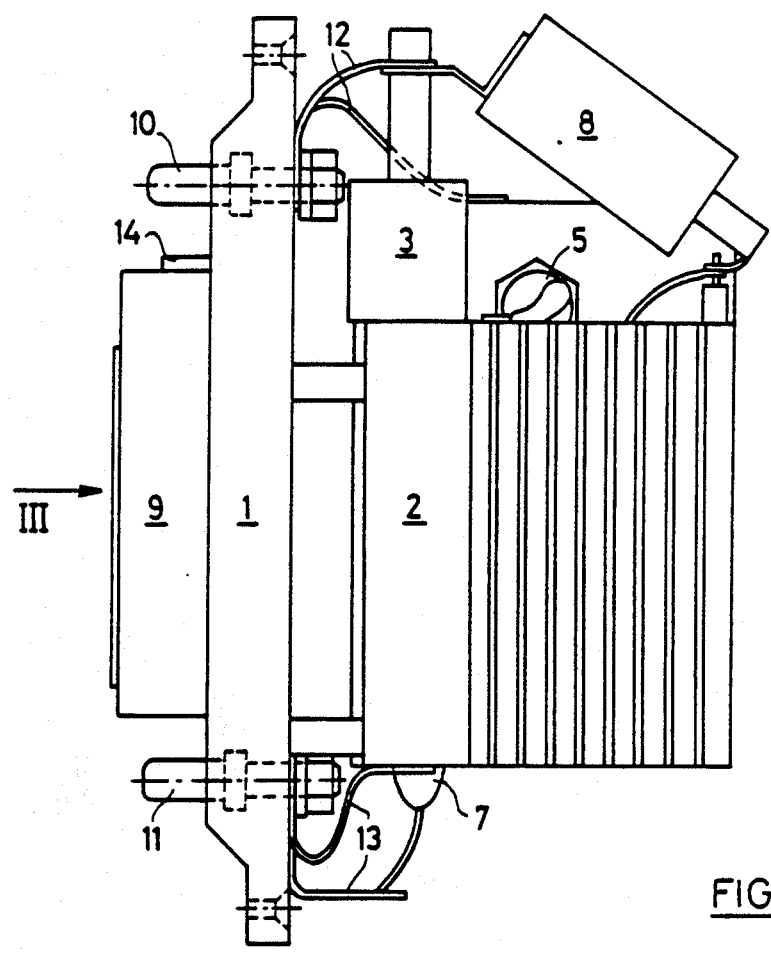
FIG. 2 shows a view in the direction of the arrow II in FIG. 1.

According to FIGS. 1 to 3, the converter modules has a single holding component in the form of a holding plate 1 composed of a suitable plastics material, preferably a foamed plastics material (for example PPO-TSG) on which all elements are fixed. A total of three cooling elements are mounted on the front of the holding plate 1 facing the viewer in FIG. 1. A first cooling element 2 for the disconnection thyristor (GTO) 3, a second cooling element 4 for the free-wheel diode 5 and a third cooling element 6 for the resistor 7. The cooling elements 2, 4 and 6 which are composed of aluminium and are ribbed in design are each screwed onto the holding plate 1 (screws S in FIG. 3) and, in turn, hold the connected electronic component, that is the thyristor 3 or the free-wheel diode 5 or the resistor 7. A capacitor 8 is also fixed on the front of the holding plate 1. All the electronic ignition and wiring means, the so-called gate driver 9 which is also modular in design, are screwed onto the rear of the holding plate 1 (screw S' in FIG. 3).

The current is supplied to the components mounted on the front of the holding plate 1 via plug-like contacts 10 and 11 which are held in the holding plate 1 and are provided with their cylindrical portion projecting from the rear of the holding plate 1 so as to engage in corresponding contacts in a base plate (not shown) arranged in the housing of the ripple control transmitter. The contacts 10 and 11 are electrically connected via corresponding rails 12 and 13 to the above-mentioned components. The contact to the gate driver 9 is made via a plug rail 14 on the rear of the holding plate 1 whose opposing part is also provided on the above-mentioned base plate. Flexes lead from this plug rail 14, on the one hand to the gate driver 9 and on the other hand to a temperature monitoring device. The cathode and the gate of the thyristor 3 are connected to contacts 15 and 16 of the gate driver 9. After inserting the holding plate 1 into the base plate by means of the contacts 10 and 11, the holding plate 1 is fixed on the base plate by means of captive bolts guided in passages 17 and 18.

Frequency changers of this type for ripple control transmission are generally produced for various powers depending on the respective requirements. The holding plate 1 described, and therefore also the corresponding base plate in the housing of the ripple control transmitter, is invariably the same and, in each case, has the contacts 10 and 11, the passages for the screws S, S' of the individual components and the passages 17 and 18 for fixing on the base plate at the same point. FIG. 3 shows a passage B for a bolt S which is free in the power type illustrated and is only required in the case of a different type with a different arrangement of cooling elements. Therefore, a change in the type of power only involves equipping the holding plate 1 with different components and does not necessitate structural changes to the holding plate 1 or the base plate.

Figure 4:
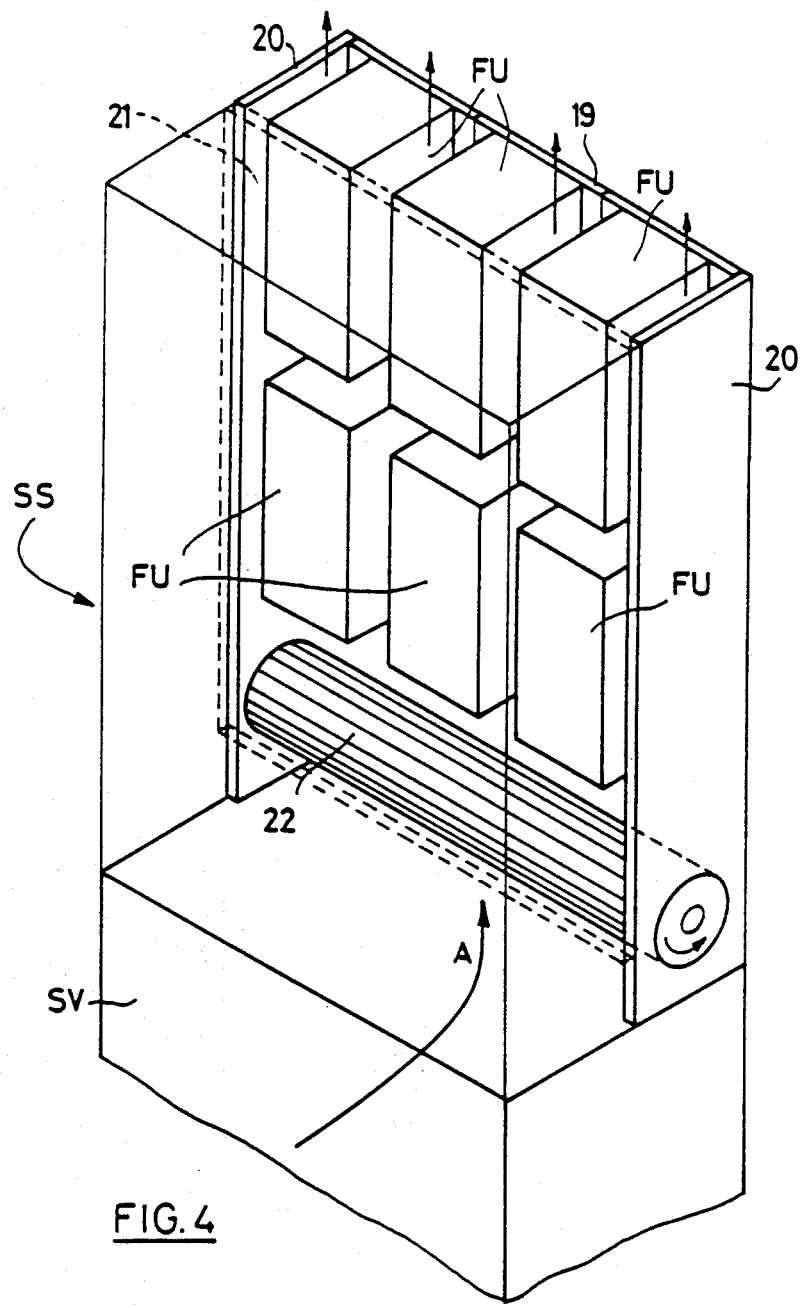
FIG. 4 shows a schematic view of the arrangement of converter modules in a ripple control transmitter.

FIG. 4 shows schematically how the frequency changer is used in practice. According to the illustration six frequency changers designated by FU are fitted in a suitable switch cabinet SS containing a current supply unit designated by SV in its lower portion. The frequency changers FU are arranged as an assembly block in a common plane in two rows for each three examples or in trree rows for each two examples and the base plates of the frequency changers FU form a rear wall 19. Two side walls 20 and a covering plate 21 are also provided. A driveable ventilation cylinder 22 is arranged beneath the assembly block and sucks in external air in the direction of the arrow A when rotated, the external air passing through various ventilation ducts between the individual columns of the frequency changers FU and between them and the side walls 20 and then escaping upwards in the direction of the sketched arrows out of the switch cabinet SS. The switch cabinet SS has suitable air inlet openings corresponding to its front door and air outlet openings corresponding to its covering plate to allow this ventilation. A control box which additionally covers the covering plate 21 at the front is arranged on the interior of the front doors of the switch cabinet SS in the region of the assembly block formed by the frequency changers FU. When the front doors are opened, the control box is pivoted away from the frequency changers FU so that the frequency changers FU are freely accessible after removal of the covering plate 21.

What is claimed is:

1. A converter module for converters which have different power capacities comprising:
   (a) a holding component comprised of a holder plate;
   (b) electronic elements, wiring elements, ignition element and cooling elements being mounted on said holder plate, each of said electronic elements being mounted on a first side of said holder plate by a cooling element such that each said electronic element is held on said plate by said cooling element, each of said cooling elements being secured directly to said holder plate;
   (c) said plate being detachably connectable to a base plate mounted on a housing, said holder plate being detachably connectable to the base plate by way of electric plug contacts which are held in the holder plate and extend therefrom and screws; and
   (d) said holder plate being provided with fixed fastening points for fastening said cooling elements to the holder plate and fixed electrical connections for supplying current to said electronic elements, said fastening points and electrical connections being arranged so that said converter module can be used with converters having different power capacities.

2. A converter module according to claim 1, wherein said electronic elements comprise a thyristor, a diode and a resistor.

3. A converter module according to claim 2, wherein said ignition elements and said wiring elements are mounted on a second side of said holder plate which is opposite to said first side, said second side of said holder plate being adapted to face toward said base plate.

4. A converter module according to claim 3, wherein the elements mounted on said first side of said holder plate are connected to said electrical plug contacts through contact rails.

5. A converter module according to claim 4, wherein teh elements mounted on said second side of said holder plate are connected to a contact rail on the holder plate which is engageable with a corresponding contact rail on said base plate.

6. A ripple control transmitter apparatus comprising a housing, a ventilating device located in said housing and a plurality of converter modules arranged as an assembly block within said housing; said converter modules being arranged in a common plane in rows and columns, the columns of converters having spaces therebetween defining ventiliation ducts for the flow of ventilating air from said ventilating device; each of said converter modules being comprised of a holding component adapted to be detachably connected within said housing, said holding component having electrical elements and cooling elements fixed thereto, said converter modules further comprising base plates attached thereto, said base plates being positioned adjacent one another to define a rear wall of said assembly block.

7. A ripple control transmitter apparatus according to claim 6 wherein said assembly block is covered by two side walls and a covering plate and ventilating air from said ventilating device is conveyed through spaces between the converter modules, the side walls and the covering plate.

8. A ripple control transmitter apparatus according to claim 7 wherein said housing is comprised of a switch cabinet having inlet and outlet openings for the ventilating air.

9. a ripple control transmitter apparatus according to claim 8 wherein said ventilating device is comprised of a driveable ventilating device located below the assembly block.

* * * * *